(12) United States Patent
Stochino

(10) Patent No.: US 6,281,752 B1
(45) Date of Patent: Aug. 28, 2001

(54) AMPLIFIER WITH IMPROVED, HIGH PRECISION, HIGH SPEED AND LOW POWER CONSUMPTION ARCHITECTURE

(75) Inventor: Giovanni Stochino, Rome (IT)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/428,999

(22) Filed: Oct. 28, 1999

(30) Foreign Application Priority Data

Jun. 18, 1999 (IT) .............................................. MI99A1371

(51) Int. Cl.[7] ....................................................... H03F 3/45
(52) U.S. Cl. ............................................. 330/255; 330/263
(58) Field of Search ..................................... 330/255, 263, 330/265

(56) References Cited

U.S. PATENT DOCUMENTS 5,034,700 * 7/1991 Herrmann et al. ................... 330/255
5,475,343 * 12/1995 Bee ....................................... 330/255
5,650,753 * 7/1997 Ling ..................................... 330/255
5,936,468 * 8/1999 Wiese et al. ......................... 330/255
5,999,054 * 12/1999 Suzuki ................................. 330/255

* cited by examiner

Primary Examiner—Robert Pascal
Assistant Examiner—Khanh Van Nguyen
(74) Attorney, Agent, or Firm—Nixon & Vanderhye PC

(57) ABSTRACT

In an amplifier with improved, high precision, high speed and low power consumption architecture, comprising an input stage (1), an intermediate stage (2) and an output stage (3), the intermediate stage (2) is provided by combining two complementary class AB operating halves (2a, 2b) which are driven by a complementary input stage, which is, in turn, class AB operating, one of said halves having a low limited current gain ($G_U$), conveniently but not necessarily controlled, and the other one having a high or very high current gain ($G_D$) which can, but not necessarily, be controlled. Suitably the input class AB operating input stage (1) of this amplifier provides two pairs or one pair of antiphase output currents ($I_R$ and $I_L$), apt to be used to feed both halves (2a, 2b) of the intermediate stage.

10 Claims, 14 Drawing Sheets

AMPLIFIER WITH IMPROVED, HIGH PRECISION, HIGH SPEED AND LOW POWER CONSUMPTION ARCHITECTURE

This invention refers to an amplifier with improved, high precision, high speed and low power consumption architecture, particularly suitable for a lot of applications.

BACKGROUND OF THE INVENTION

It is well known, in the field of analog electronics, that implementation of systems meeting requirements where high precision, low power consumption and high sped are simultaneous required is more and more requested. The main problem is to balance such requirements that, according to the known techniques, are in conflict with each other. Therefore, designers are forced to find the best trade off for their specific application.

The requirements which designers should try to meet may be resumed as:
DC precision (Low Input Offset Voltage, Vos, and Input Offset Currents, Ios, and Low Bias Currents, Ib);
AC precision (Low Noise, Wide Power-Bandwidth and Low Distortion);
High speed and Wide dynamic range;
Low power consumption The main object of this invention is to provide innovative solutions, which substantially mitigate existing problems and can be applied to both voltage feedback and current feedback architectures.

PRIOR ART AND RELATED PROBLEMS

It is first of all to take into account the present prior art, related to amplifier architectures and their constraints.

The main characteristics of conventional architectures, which make use of class A or AB operation in the input stage and of class A operation in the intermediate stage, can be examined by referring to FIG. 1 of the annexed drawings, where the simplified block diagram of a conventional voltage-feedback operational amplifier is shown.

The input stage is a differential voltage to current converter, wherein $$g_m = (I_R - I_L)/(V_1 - V_2)$$

is the transconductance and $V_{os}'$ is the offset voltage of the input stage. The current available from the input stage is limited to $I_B$ by the bias network, for class A operated input stages and is much higher than $I_B$ for class AB operated input stages.

The intermediate stage is a high-gain current amplifier, the output of which is given by $$I_N = G_D(I_R - I_L) + I_{os}$$

where $G_D \to \infty$, and Ios is the intermediate stage output offset current. Therefore, the output voltage is given by $$V_o = V_o' - [I_Q - G_D(I_R - I_L) - I_{os}]R_i.$$

It is worth noting that this scheme shows remarkable feature that the operating point of the intermediate stage, being $V_o$ dependent on $I_{PO} = I_Q$, which in this context acts as a reference current, is forced to $I_{NO} = I_{PO} = I_Q$ when feedback loop is closed around the amplifier. Therefore, regardless of the actual value of $G_D$, the operating point is very stable.

The output stage is usually a complementary common collector class AB stage (generally $G_O = 1$) which is capable of providing peak output currents well in excess of the quiescent current.

$V_{OS}(O)$ is the offset voltage of the output stage.

$C_o$ is the frequency compensation capacitance, which sets the dominant pole and the phase margin of the amplifier, and $R_i // C_i$ is the combination of the output impedance of the intermediate stage and the input impedance of the output stage.

In this amplifier, output voltage is given by $$V_O = (V_1 - V_2) \cdot A_{OL} + V_{OST} \quad (1)$$

where $$A_{OL} = g_m G_D R_i \quad (2)$$

is the DC open loop gain, and $$V_{OST} = A_{OL} V_{OS}(i) + I_{OS} R i + V_{OS}(o) \quad (3)$$

is the total output offset voltage, while the input offset voltage $V_{OS}$ is the one given by the total offset output voltage, divided by the open loop gain, that is $$V_{OS} = \frac{V_{OST}}{A_{OL}} = V_{OS}(i) + \frac{I_{OS}}{g_m G_D} + \frac{V_{OS}(O)}{g_m G_D R i} \quad (4)$$

Since in this architecture $G_D \to \infty$, the contribution to the offset of the intermediate and output stage is virtually null and equation (4) becomes:

$$V_{OS} \approx V_{OS}(i) \quad (5)$$

Furthermore, unity gain frequency for small signals in the same amplifier is given by $$f_T = g_m / 2\pi C_o \quad (6)$$

while maximum speed is given by the slew-rate limit $SR = dV_o/dt = dV_o'/dt$, which is set by the maximum current available to charge and discharge node B capacitances found in the amplifier.

Therefore, considering again the architecture of FIG. 1 and neglecting the current through $R_i$, the maximum limit of rising edge slew-rate SRB(r) at node B is equal to $$SR_B(r) = I_P/(C_o + C_i) = I_Q/(C_o + C_i) \quad (7)$$

since the current available is $I_P = I_{PO} = I_Q$. For this to be true, it is necessary that the current flowing through $C_o$ from node B, which equals $I_{co} = I_P C_o/(C_o + C_i)$ is sustained at node B by the input stage. Since the current available at node A is $I_B$, then it is necessary that $$I_B \geq I_P C_o/(C_o + C_i) \quad (8)$$

Inequality (8) is not usually satisfied, since the bias current $I_B$ has to be limited to few milliamps for reasons of noise performance, dc precision and frequency stability (since gm is proportional to $I_B$). Therefore the maximum limit of rising edge slew rate will be given by $$SR_B(r) = I_B/C_o \quad (7A)$$

With the same assumption, since the current available at node B for discharging all node capacitances is only limited by the gain of the intermediate stage, which for assumption is very high, i.e. $G_D \to \infty$, the maximum limit of falling edge slew-rate $SR_B$ (f) at node B still depends on the current available at node B for discharging $C_o$, so that one can finally write $$SR_B(f) \approx SR_B(r) = (I_B)/(C_o) \quad (9)$$

which represents the main limit to the slew-rate for class A input stages.

Resuming, the advantages of conventional amplifier architectures of FIG. 1, may be summarised as a high DC open loop gain, a low noise and a high DC precision; the disadvantages as poor slew-rate performances, which are determined by the class A input stage, then in the poor width of power band, wherein $f_{max} = SR/2V_{peak}$.

For instance:

$I_B$=0.5 mA, $I_P$=2 mA, $C_o$=30 pF, Ci=10 pF, Ri=100 k, gm=0.001 Vos(i)=1 mV, Ios=0.1 mA, Vos(o)=5 mV

Then eq. (4) yields about Vos=1 mV, while eq. (6) and (8) yield 50 V/μs and 16.6 V/μs, respectively.

This example shows that dc precision of the amplifier, as well as its speed, strongly depend on the performance of the input stage.

Solutions to the problem of speed limitation, which is typical of class A architectures, are already known. This problem is normally dealt with according to two different choices of architecture: 1) Amplifier architecture with class AB input stage and class A intermediate stage; 2) Amplifier architecture with all class AB stages.

In the first case, an effective means of overcoming the problem of the limit set by ep. (9) is available, since in class AB input stages the available peak output current, $I_{i(max)}$, is much higher than the total bias current $I_B$. Indeed:

$$SR_B(r) = I_Q/(C_o + C_i) \quad (10)$$

$$SR_B(f) = I_{i(max)}/(C_o) \quad (11)$$

As a result the situation is such that $SR_B(f) > SR_B(r)$, and the slew-rate limit in these architectures is set by the class A intermediate stage. Slew rate can be increased only by increasing $I_P = I_{PO} = I_Q$ proportionally, but there is a practical limit set by power consumption and dc-ac precision requirements.

A higher slew-rate than in the basic architecture is thus obtained, but with a lower DC and AC precision, due to the increased complexity of the input class AB stages.

The most robust and used configuration shown in FIG. 2A and derived from circuit techniques well established in current-feedback amplifier architectures, corresponds to the second case, which is a must when a high value of slew rate is necessary. Here, the most important thing to notice is the use of two low current gain complementary halves (usually unit gain current mirrors) in the intermediate stage. Low dc gain is needed to keep bias current IQ under control. The simultaneous use of two high current gain halves, would, in fact, compromise the stability of operating point in the intermediate stage. Since this aspect represents the major limit of this type of amplifier and the present invention aims at overcoming this limit, the latter will be studied more in details in the following.

Referring to FIG. 2a, it is possible to write $$I_P = G_D(I_L - I_{REF}) = G_D(I_B + I_a - I_{REF}) \quad (12)$$

$$I_N = G_D(I_R - I_{REF}) = G_D(I_B - I_a - I_{REF}) \quad (13)$$

where $I_B$ is the quiescent current of the input stage, $I_{REF}$ is a reference current (virtually equal to $I_B$), and $I_a = g_m(V_1 - V_2)$ is the signal current from the input stage, which drives the intermediate stage. Note that the $I_L$ and $I_R$ are always positive and the respective signal currents they carry, $I_a$, are antiphase. Moreover, they are usually limited to $I_{MAX}$. Vo can therefore be written as $$V_O = Ri \cdot I_O = Ri \cdot [I_P - I_N] = 2G_D Ri \cdot [I_L - I_R] = I_Q - I_Q + 4G_D Ri \cdot I_a = 4G_D Ri \cdot I_a \quad (14)$$

Where $$I_Q = G_D(I_B - I_{REF}) \quad (15)$$

is the quiescent current of the intermediate stage, given by eq. (12) or (13) by setting $I_a$=0 and which cancels out in eq (14).

Note that in Vo expression as given by eq. (14), the quiescent currents $I_Q$ of the upper and lower halves cancels out, so that, contrary to FIG. 1, $V_O$ is not bound to $I_Q$, and no reference is here available for stabilisation of the intermediate stage bias.

The consequence is that feedback when applied to the overall amplifier, contrary to what happens with FIG. 1 scheme, cannot do anything to stabilise $I_Q$. It has to be stressed, that the feedback function in a voltage-feedback amplifier, is to keep the output voltage under control, and, as expressed by eq. (14), there is no relation between Vo and $I_Q$, so that $I_Q$ can vary without affecting Vo.

This fact is qualitatively shown in FIG. 2b, where it is apparent how Vo can remain constant, regardless of the changes of the quiescent current of the intermediate stage. In this figure, the transfer curves of both upper and lower halves of the intermediate stage for different values of the input stage quiescent current $I_B$ is qualitatively shown.

The quantitative extent of the instability of the idle condition is given by Eq. (15), which shows that $I_Q$ variation can be very large, even for small changes of the difference $I_B - I_{REF}$.

In order to assess the problem of the inherent instability of the operating point of such an architecture, let us take into account the sensitivity of $I_Q$ to small variations of $G_D$ and/or $I_B$, due to temperature changes, component mismatch and tolerances. It can be easily calculated that $$S_{GD}^{Iq} = \frac{G_D}{Iq} \cdot \frac{dIq}{dG_D} = \frac{G_D}{Iq} \cdot (I_B - I_{REF}) = 1 \quad (16)$$

$$S_{IB}^{Iq} = \frac{I_B}{Iq} \cdot \frac{dIq}{D_{IB}} = \frac{I_B}{Iq} \cdot G_D = \frac{I_B}{(I_B - I_{REF})} \quad (17)$$

in order to have an idea of how large the sensitivity given by eq. (17) is, let us consider the following example: $G_D=10^5$, $I_Q$=2 mA (as a design objective), $I_B$=0.5 mA for which eq. (17) yields 25×10³, which means a variation of $I_B$ of 1% with a corresponding variation of $I_Q$ of 250× 10³%, without influencing the output voltage Vo.

The above discussion and example show that such architectures make use of low current gain intermediate stages (usually a current mirror, where $G_D$ is close to unity), in order to stabilise the operating point of the intermediate stage. In such schemes there is no need for a reference current, therefore $I_{REF}=0$ When studying in deeper detail performances of such architectures, it is to be noted that, on the contrary than in architectures comprising intermediate class A stages, the contribution to Vos of intermediate and output stages in them are very important. Indeed, one may see that output voltage is:

$$V_O = (V_1 - V_2) \cdot A_{OL} + V_{OST} \quad (18)$$

where $$A_{OL} = g_m Ri \quad (19)$$

is the DC open loom gain, and $$V_{OST} = A_{OL}V_{OS}(i) + I_{OS}R_i + V_{OS(o)} \quad (20)$$

is the output offset voltage

The equivalent or total input referred offset voltage $V_{OS}$ is then given by the output voltage divided by the open loop gain, that is $$V_{OS} = \frac{V_{OST}}{A_{OL}} = V_{OS(i)} + \frac{I_{OS}}{g_m} + \frac{V_{OS(o)}}{g_m R_i} \quad (21)$$

If one compares eq. (20) with eq. (4), it is possible to appreciate that, contrary to the class A architecture, the contributions to Vos from the intermediate and output stages are very important.

As for bandwidth and speed in the architecture shown in FIG. 2A, it is to be noted that, whilst unity gain frequency for small signals is still given by $$f_T = g_m/2\pi C_o, \quad (22)$$

as in the architecture of FIG. 1, maximum speed is now, in the scheme of FIG. 2A, given by $$SR_B(r) \approx SR_B(f) = I_{i(max)}/(C_o + C_i) \quad (23)$$

Also in this architecture first order slew rate limit is still set by the class AB input stage, but it is much higher than in the previous case, due to the higher dynamic range in input stage, since:

$$I_{i(max)}/(C_o + C_i) \gg I_B$$

where $I_B$ is the bias current of the input stage. The peak current $I_{i(max)}$ can be as high as a hundred times $I_B$, so that second order slew rate limiting mechanisms cannot longer be ignored, for instance, such as the simultaneous conduction of upper and lower half of the intermediate stage during fast transients.

Systems of the kind just described allow to obtain slew-rate and width of the power band higher than the ones of other well known architectures. On the other hand, they give rise to a DC current gain and to both DC and AC precision substantially lower, mainly due to the limited gain in the intermediate stage. For example, if:

Ii (max)=10 mA, Co=30 pF, Ci=10 pF, Ri=100 k, gm=0.001
Vos(i)=1 mV, Ios=0.1 mA, Vos(o)=5 mV then eq. (15) yields Vos=101 mV, while eq.(16) yields SR=250 V/$\mu$s In some cases designers can make use of composite amplifier architectures, where a dc precision amplifier is used in a servo loop to correct the poor precision of the high speed parallel amplifier. The overall (or composite) amplifier, which is achieved in this way, has good precision but inadequate settling performance, due to interactions between the servo amplifier and the main amplifier. Therefore, they can be used only in ac band-pass amplifiers, not for applications, where good performance in a wide range of frequencies—including DC—is required.

To conclude the previous discussion clearly confirms the well known situation that known solutions force designers to trade off the inherent precision of the architecture in FIG. 1, with the speed of the architecture in FIG. 2a, and viceversa.

SUMMARY OF THE INVENTION

The problems above are now brilliantly solved by this invention, which involves further advantages and improvements, such as reported below.

It refers to an amplifier with improved, high precision, high speed and low power consumption architecture, comprising an input stage, an intermediate stage and an output stage, characterised in that the intermediate stage is obtained by combining two complementary class AB operating halves, which are driven by a complementary input stage, which, in turn, is class AB operating, one of said halves having a low limited current gain and the other having a high or very high current gain.

Advantageously, the class AB operating input stage of this amplifier can provide two pairs of antiphase output currents ($I_R$ and $I_L$), apt to be used to feed both halves of the intermediate stage.

Preferably, the current gain of said first half of the intermediate stage is controlled. Also the current gain of the second half of the intermediate stage may be controlled.

BRIEF DESCRIPTION OF DRAWINGS

The invention is now described in deeper detail below, referring to figures and schemes of the annexed drawings, wherein:

FIG. 8 is a diagram showing the square-wave response to small signals of architecture in FIG. 5a;

DESCRIPTION OF A PREFERRED EMBODIMENT OF THE INVENTION

Figure 3A:
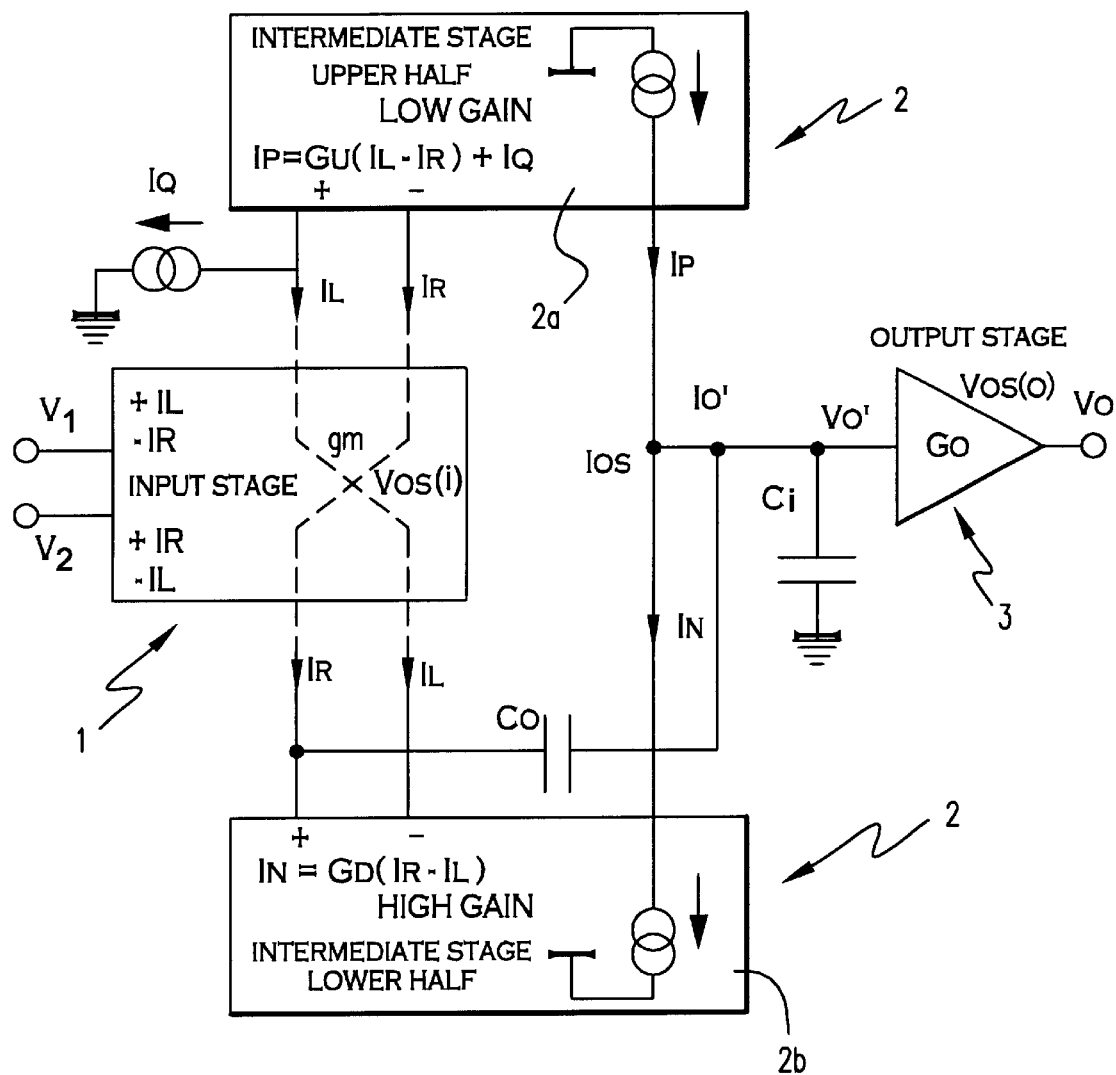
FIG. 3a represents the amplifier with improved, high precision, high speed and low consumption architecture of this invention, in a block diagram.

Referring to FIG. 3a, the main features of the new architecture proposed by the invention for an amplifier including an input stage 1, an intermediate stage 2 and an output stage 3 reside in: that the intermediate stage is a combination of two complementary class AB operating halves 2a and 2b; that the upper half 2a of said intermediate stage has a low limited and conveniently, but not necessarily controlled current gain $G_U$; and that the low half 2b of the same stage involves a high or very high current gain $G_D$. Moreover, in the basic version of this amplifier, the input stage provides two pairs of antiphase output currents, $I_R$ and $I_L$ respectively, apt to be used to feed the halves 2a and 2b of the intermediate stage 2.

A first set of equations can be written for the scheme of amplifier possessing the architecture of FIG. 3a:

$$I_R = I_B + Ia \geq 0 \quad (24)$$

$$I_L = I_B - Ia \geq 0 \quad (25)$$

where $I_B$ is the quiescent current and Ia is the signal current. It is therefore possible to write $$V_O = Ri \cdot [I_P - I_N] = (G_D + G_U) Ri \cdot [I_L - I_R] + Ri G_U \cdot I_Q = Ri[2G_D \cdot Ia + G_U \cdot I_Q] \quad (26)$$

where $G_U \cdot I_Q$ is the bias current of the upper half 2a of the intermediate stage 2 and $G_D + G_U \equiv G_D$.

It is possible here to point out that $V_O$ in eq. (26) above, contrary to what happens in eq. (14), is linked to $I_Q$.

Figure 2A:
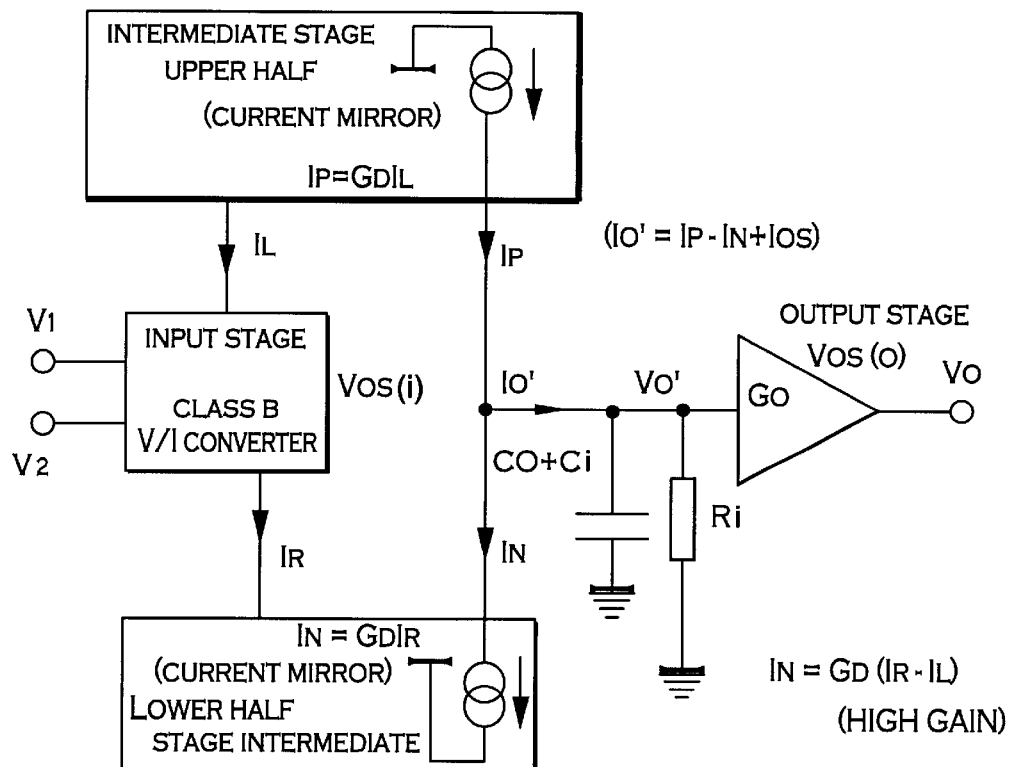
FIG. 2a is the block diagram of the strongest and most used configuration in the conventional technique for the amplifier in FIG. 1.

In order to appreciate the different behavior of the architecture depicted in FIG. 3a from the known high speed architecture in FIG. 2a, it is to be considered the operation of the intermediate stage 2 in the neighborhood of the idle condition, that is for Ia=0 (i.e. $V_1 - V_2 = 0$), assuming $G_D \to \infty$ and $G_U \approx 1$ (but the same reasoning applies for higher values of $G_U$, say up to 10, provided that it is well controlled, for instance by negative feedback). It results in:

$$I_P = I_Q \quad (27)$$

$$I_N = G_D \cdot 2Ia(Ia \to 0) \quad (28)$$

Due to its lower gain (compared with $G_D$) the quiescent condition of the upper half 2a of the intermediate stage 2 is fixed and can act as a reference for the lower half 2b, whilst the one of the lower half, due to its high gain, is still controlled by the difference of input voltage (through Ia). The consequence of this new situation is that by applying the overall feedback to the amplifier, it is now possible to force the operating point to the following stable condition $$I_N = I_P = I_Q \quad (29)$$

Figure 2B:
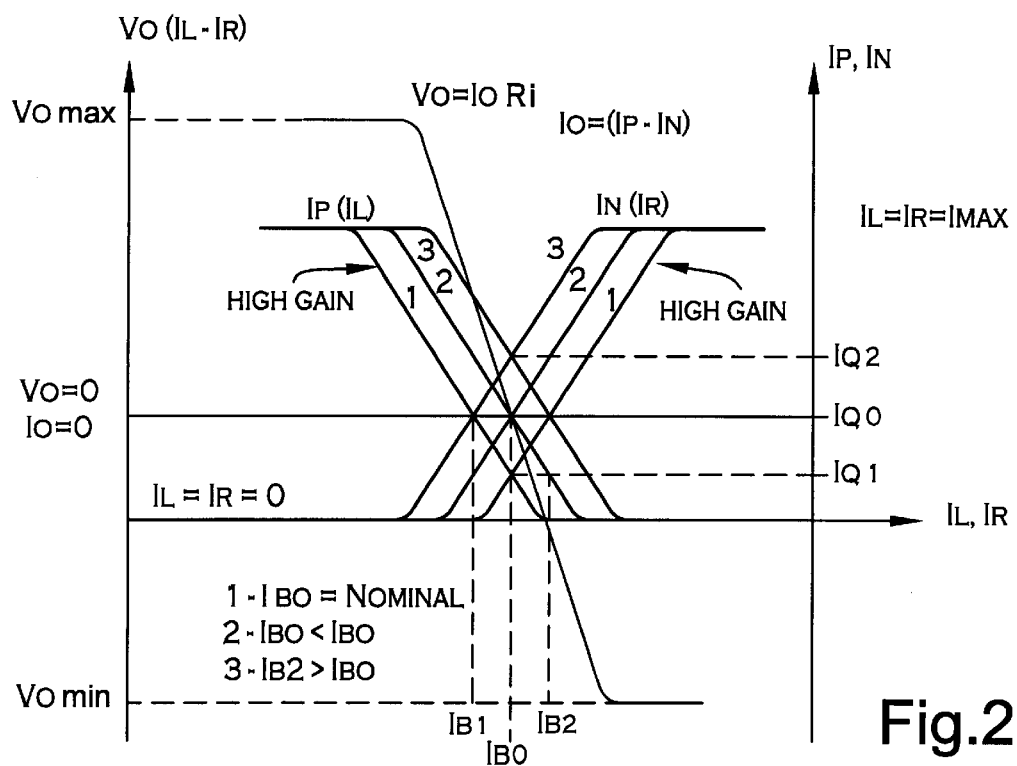
FIG. 2b is a diagram, which qualitatively represents the transfer curves of both upper and lower halves of the intermediate stage, as well as the transfer curve of the intermediate stage as a whole, of an amplifier according to the scheme of FIG. 2a at different values of quiescent current $I_B$ of the input stage, also previously discussed.
Figure 3B:
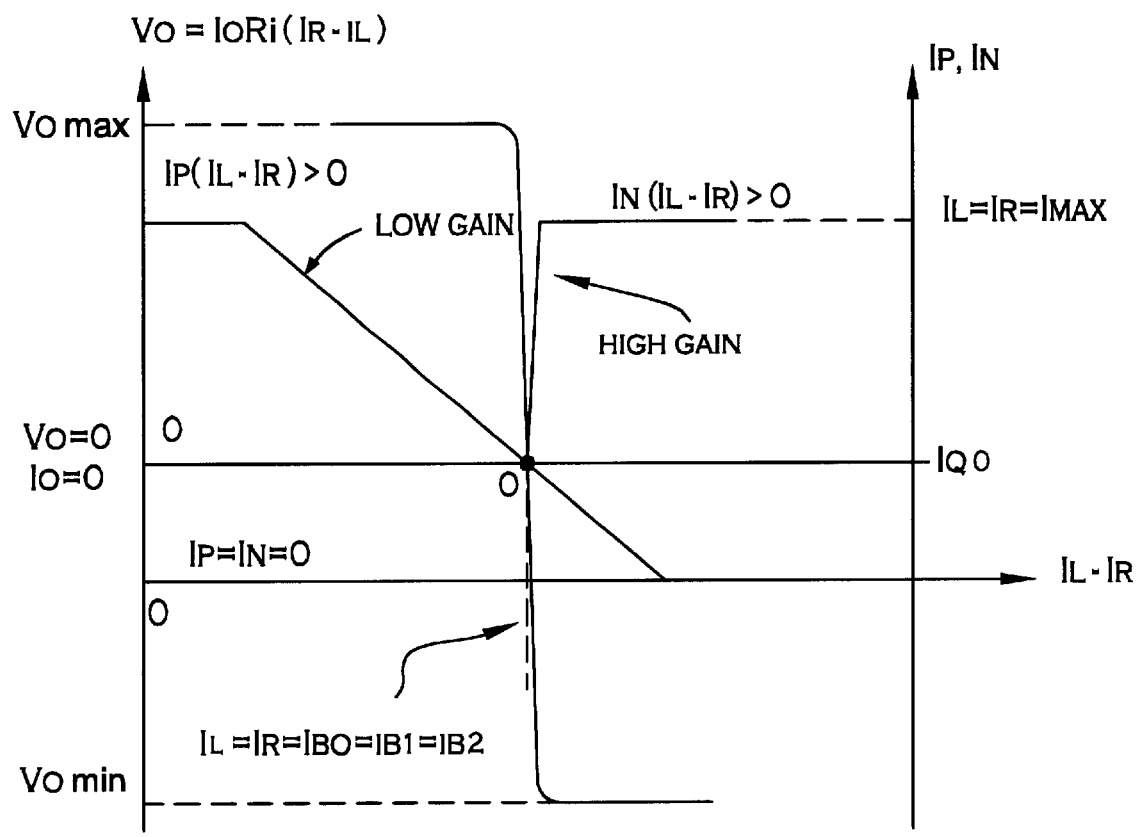
FIG. 3b is diagram similar to the one of FIG. 2b, showing the high stability of the operating point achievable with the amplifier according to the invention.

FIG. 3b graphically shows on the suitable scale (different than FIG. 2b), how there is only one stable operating point for the intermediate stage for the architecture in FIG. 3 upon different values of $I_B$.

When considering the performance of the amplifier architecture according to FIG. 3a, it is seen that the output voltage of amplifier is given by:

$$V_O = (V_1 - V_2) \cdot A_{OL} + V_{OST} \quad (30)$$

where $$A_{OL} = g_m(G_D + G_U) Ri \quad (31)$$

is the DC open loop gain, and $$V_{OST} = A_{OL} V_{OS}(I) + I_{OS} Ri + V_{OS(o)} \quad (32)$$

is the output offset voltage.

As for the input offset voltage Vos, it is still given by output voltage divided by the open loop gain, that is $$V_{OS} = \frac{V_{OST}}{A_{OL}} = V_{OS(i)} + \frac{I_{OS}}{g_m(G_D + G_u)} + \frac{V_{OS(O)}}{g_m(G_D + G_U) Ri} \quad (33)$$

Figure 1:
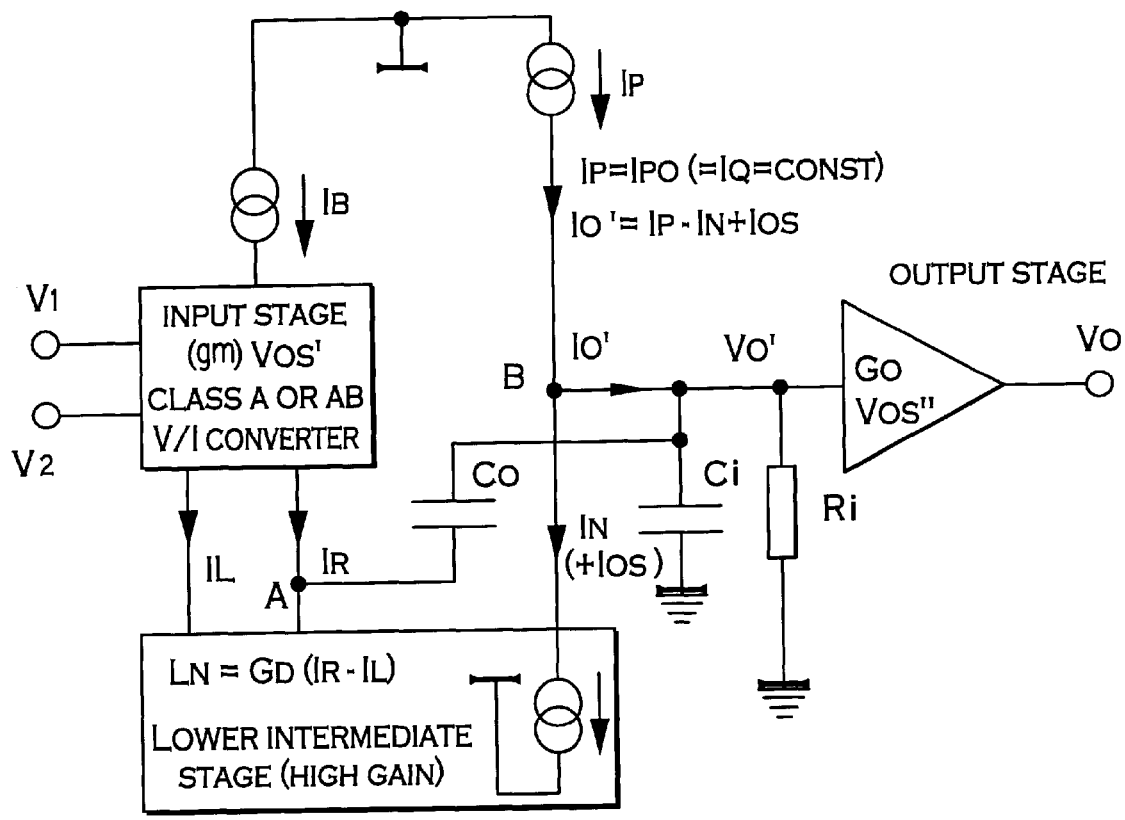
FIG. 1 shows a simplified block diagram of an amplifier operating in voltage feedback of the prior art, already discussed above.

Both equations (31) and (33) are similar to the corresponding equations (2) and (4) of architecture in FIG. 1, so that for $G_D \to \infty$ equation (33) reduces to $$V_{OS} \approx V_{OS(i)} \quad (34)$$

As for bandwidth and speed, the unity gain frequency for small signals of the amplifier of FIG. 3a is given by:

$$f_T = g_m / 2\pi Co \quad (35)$$

while maximum speed (considering only first order limitations) is now given by $$SR_B(r) = \frac{I_{i(max)}}{(Co + Ci)} \quad (36)$$

$$SR_B(f) = \frac{I_{i(max)}}{Co} \quad (37)$$

There is a small asymmetry which is explained by the fact that the high gain lower half 2b can provide virtually infinite current ($I_N$), while $I_P$ is limited to the peak current $I_{i(max)}$ of the input stage 1. However, since usually Co>>Ci, positive and negative slew-rates are very close to the figures of the full class AB architecture, depicted in FIG. 2a.

The architecture of amplifier according to the invention simultaneously offers the advantages of both high precision and high speed schemes.

Thus, the designer is not longer forced to trade off speed for precision, since the new proposed solution simultaneously provides the best features of the known ones, namely high gain and AC and DC precision of the architecture in FIG. 1, together with the high speed of the architecture in FIG. 2a.

It is also worth to be stressed that maximum slew-rate does not depend on the quiescent current of the amplifier. In fact $I_B$ and $I_Q$ do not appear in the above equations (36) and (37); so they can be set, in principle, as low as convenient. This is the reason why the architecture according to the invention is particularly suited for applications, where dc-ac precision, high speed and low power consumption are the main requirements.

To summarise:
the solution according to this invention allows to obtain higher slew-rate and power band-width than architecture of FIG. 1, with the same DC precision and noise, with a lower power consumption upon the same performance and with an improved phase margin, due to the contribution of high frequency phase lead of the half 2a of the intermediate stage 2;
the solution according to the present invention allows to achieve an open loop gain higher by 40–60 db, much higher DC and AC precision (offset voltage and noise) than the architecture in FIG. 2a, with a comparable slew-rate.

Figure 4A:
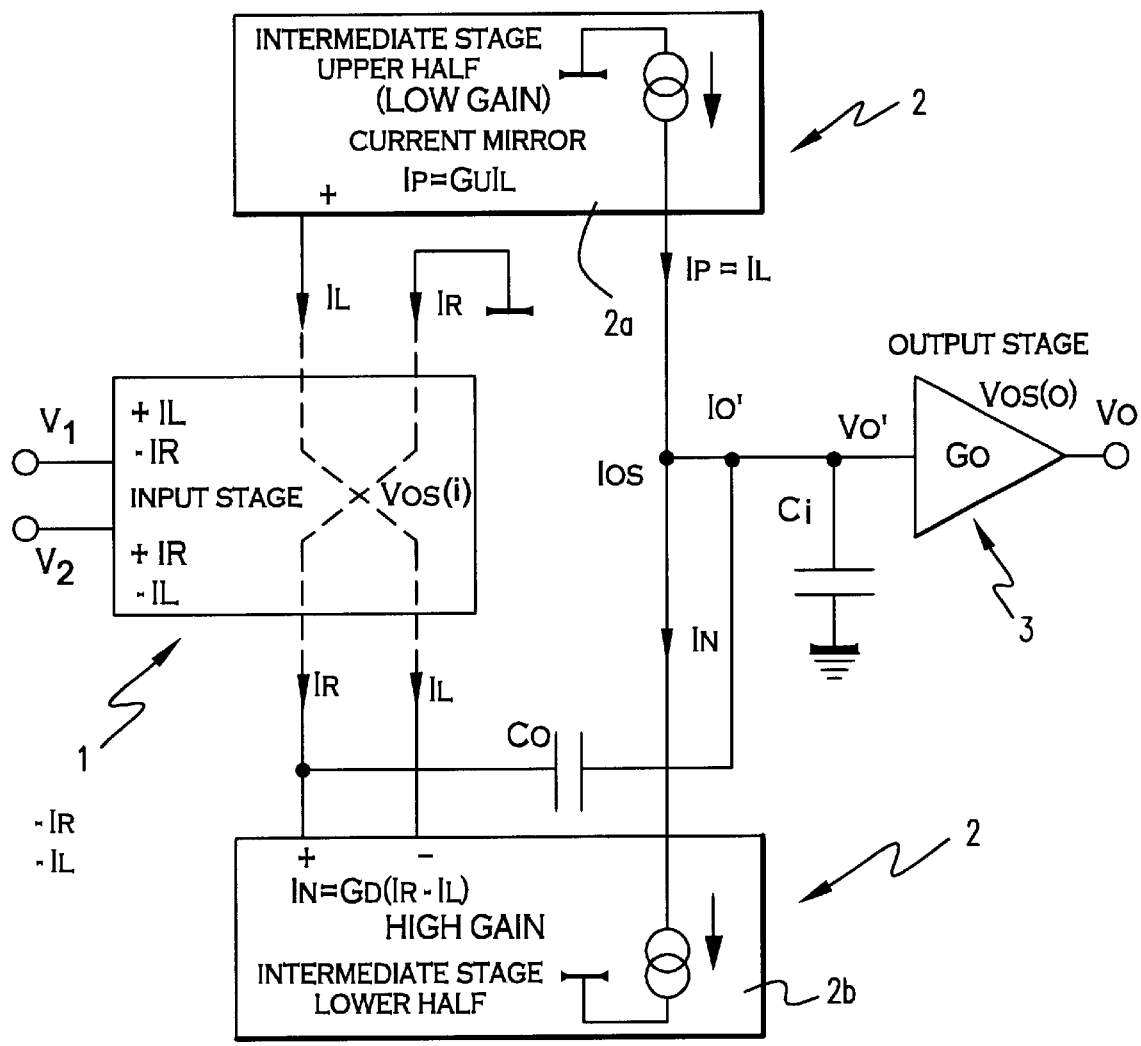
FIGS. 4a and 4b are block diagrams, showing two different embodiments of the amplifier in FIG. 3a, according to the invention.
Figure 4B:
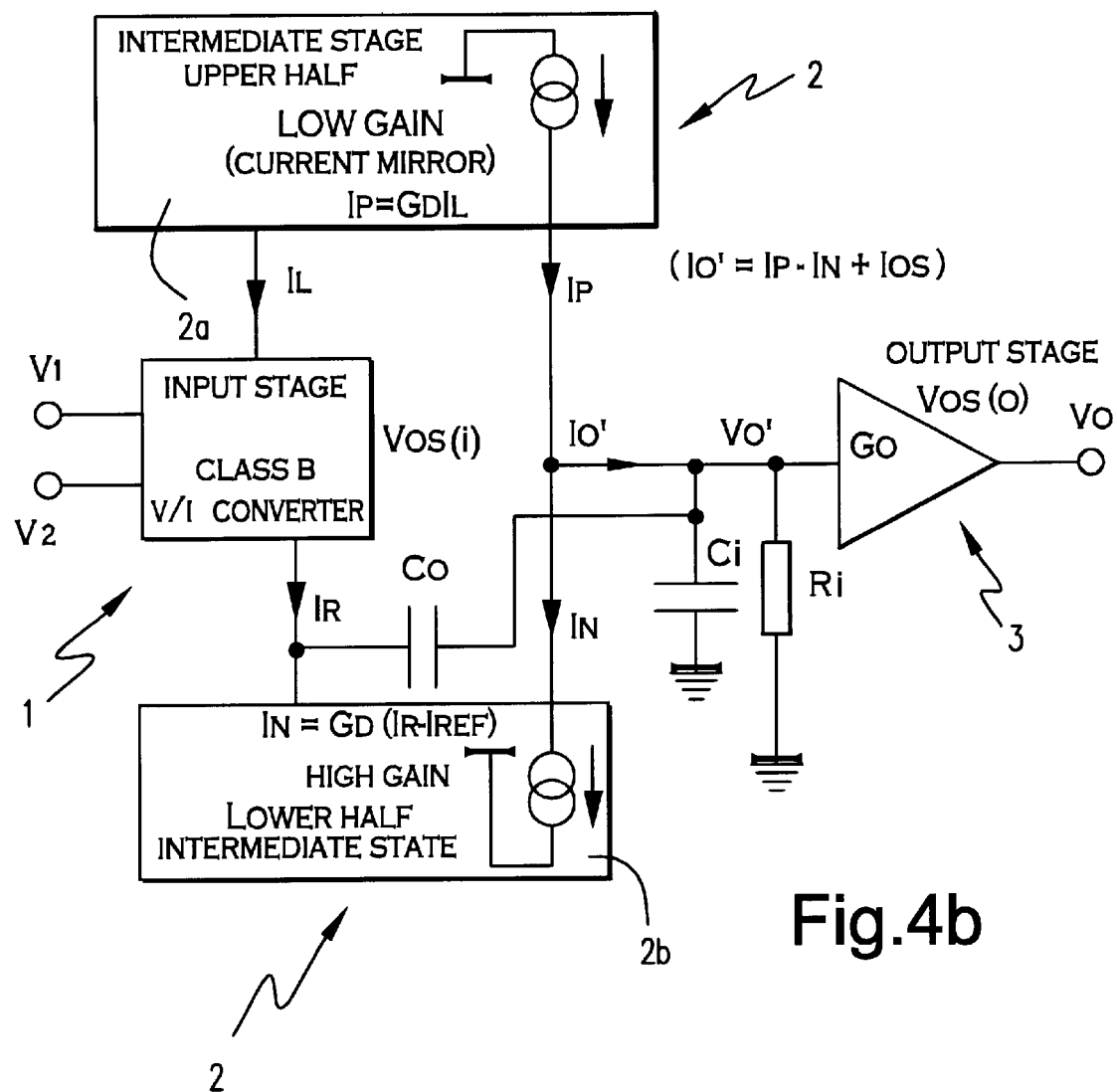

Furthermore, the basic architecture, shown in FIG. 3a, of the amplifier according to the invention can be varied or broadened, for instance according to the embodiments shown in FIGS. 4a and 4b, which form integral part of the invention.

In the embodiment shown in FIG. 4a, a current generator setting the bias $I_Q$ is avoided. Indeed, bias current of the intermediate stage 2 is set, in this case, by the input stage itself on $I_Q=I_B$.

There is the same difference from the architecture of FIG. 3a in the case of the architecture in FIG. 4b, in which, moreover, both upper half (low gain) 2a and lower half (high gain) 2b of the intermediate stage 2 have only one driving input (in a similar way as in the scheme in FIG. 2a). Similarly, the input stage 1 has two single ended outputs $I_L$ (upper arm) and $I_R$ (lower arm), having suitable mutual phase relationships. The input stage 1 can be asymmetrical (an input has high impedance, while the other has low impedance), such as in the schemes of feedback current amplifiers, or symmetrical (both inputs having high impedance).

It is finally worth highlighting the feature that the inventive architecture can be implemented by using either Bipolar or MOS or BiCMOS IC technologies.

The effectiveness and viability of this invention in the foreseen application areas have been proven both by SPICE simulation of a practical example of operational amplifier and by implementation of an experimental prototype of the same amplifier. SPICE simulation results are very close to the results of measurements performed on the prototype, so, only the most significant SPICE simulation results are briefly reported.

Figure 5A:
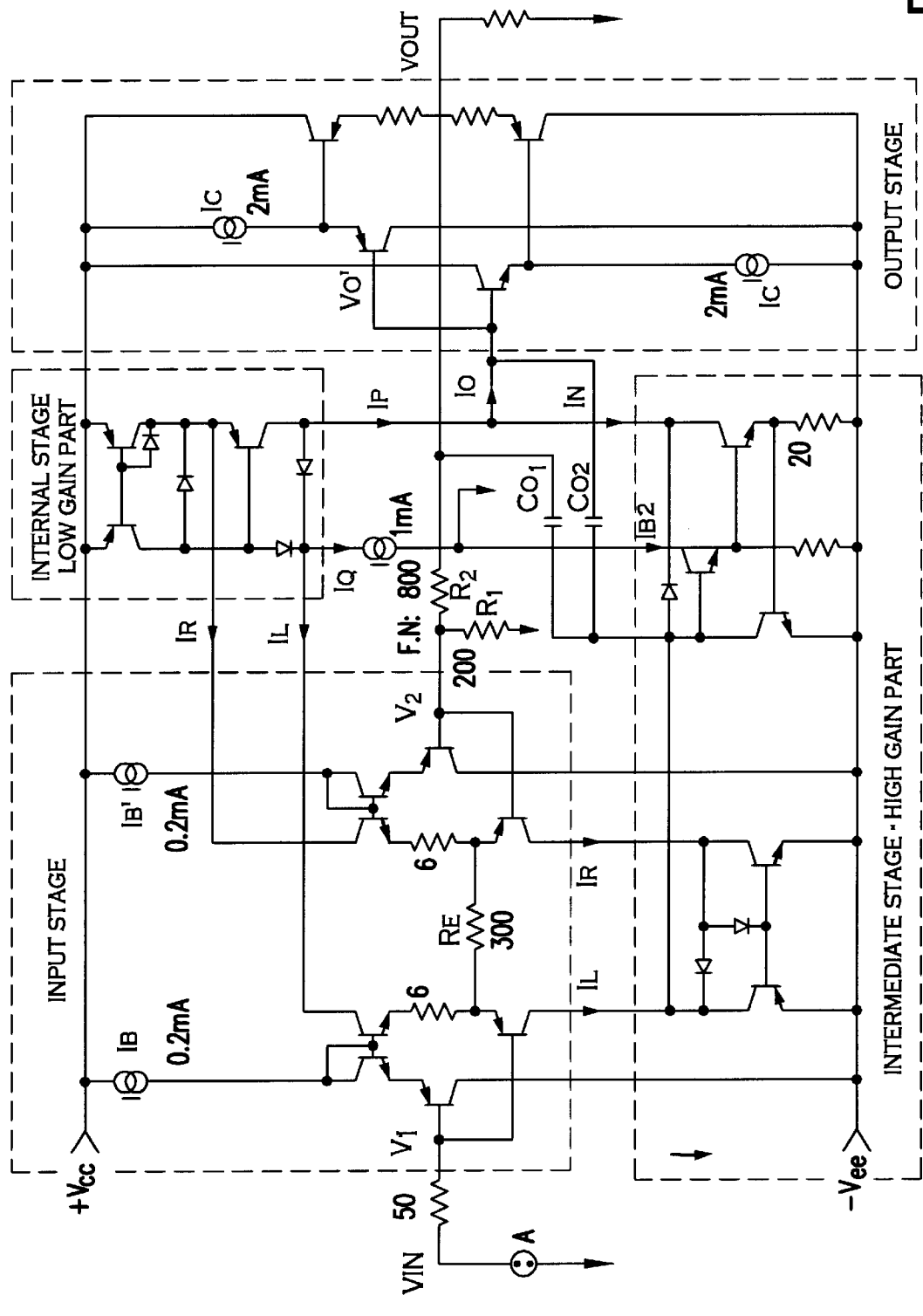
FIG. 5a shows a practical embodiment of the improved architecture of amplifier according to the invention, on which a SPICE simulation is effected.

FIG. 5a shows the complete scheme of the practical implementation of the architecture which has been chosen to demonstrate the effectiveness of the technique proposed by the invention.

The same figure also shows how it relates to the basic architecture depicted in FIG. 3a. All relevant stages, as well as all important signal paths and names, are indeed represented.

Nominal input stage transconductance is $g_m-1/RE=1/300\ \Omega^{-1}$.

Furthermore, it is approximately
$G_U=1$ and $G_D=\beta n^2=15\times 10^4$
where $\beta n$ is the current gain of npn transistors.

$C_{O1}$ and $C_{O2}$ are two capacitances for frequency compensation.

Figure 5B:
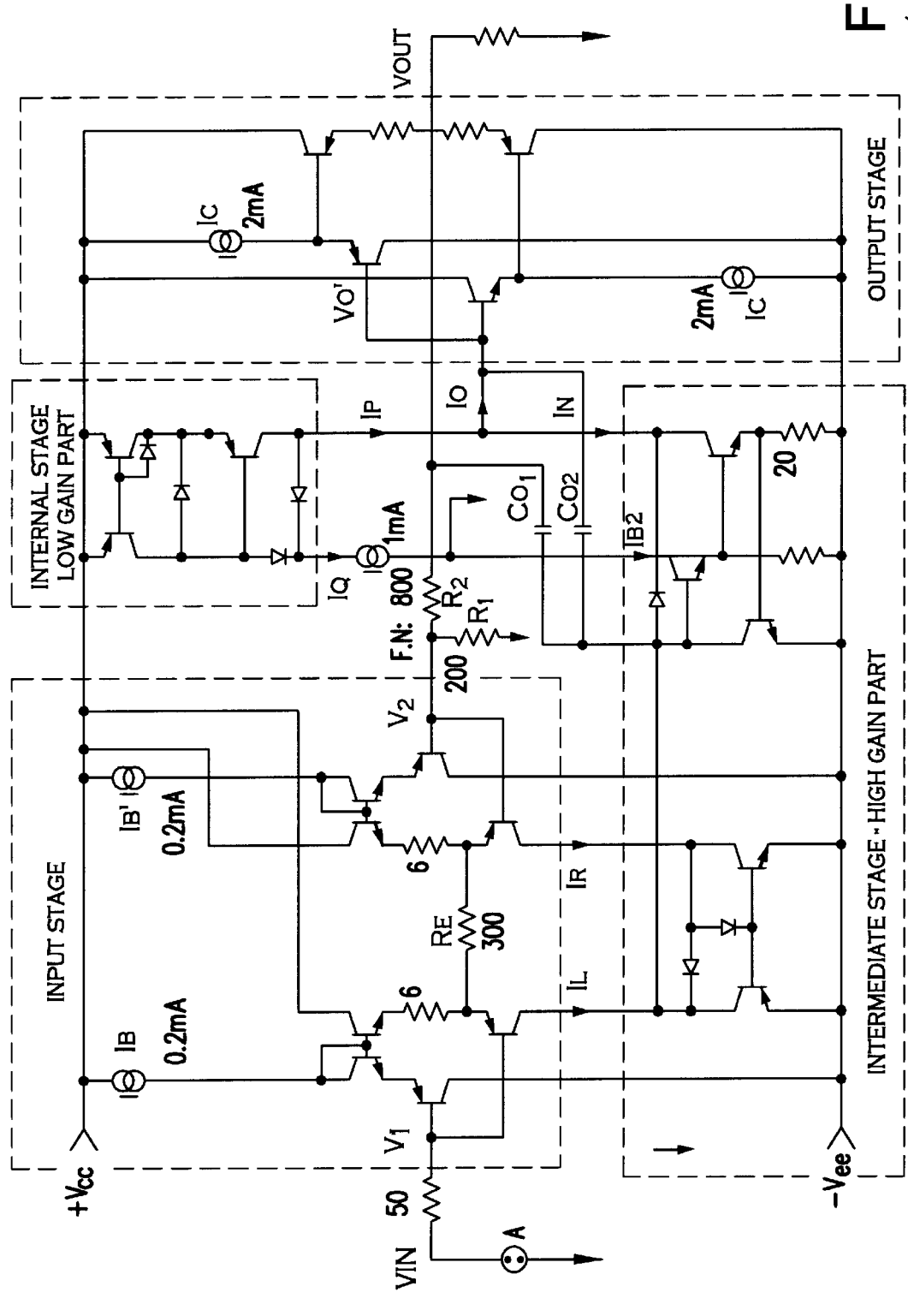
FIG. 5b is an embodiment similar to the one of FIG. 5a, according to the prior art.
Figure 6:
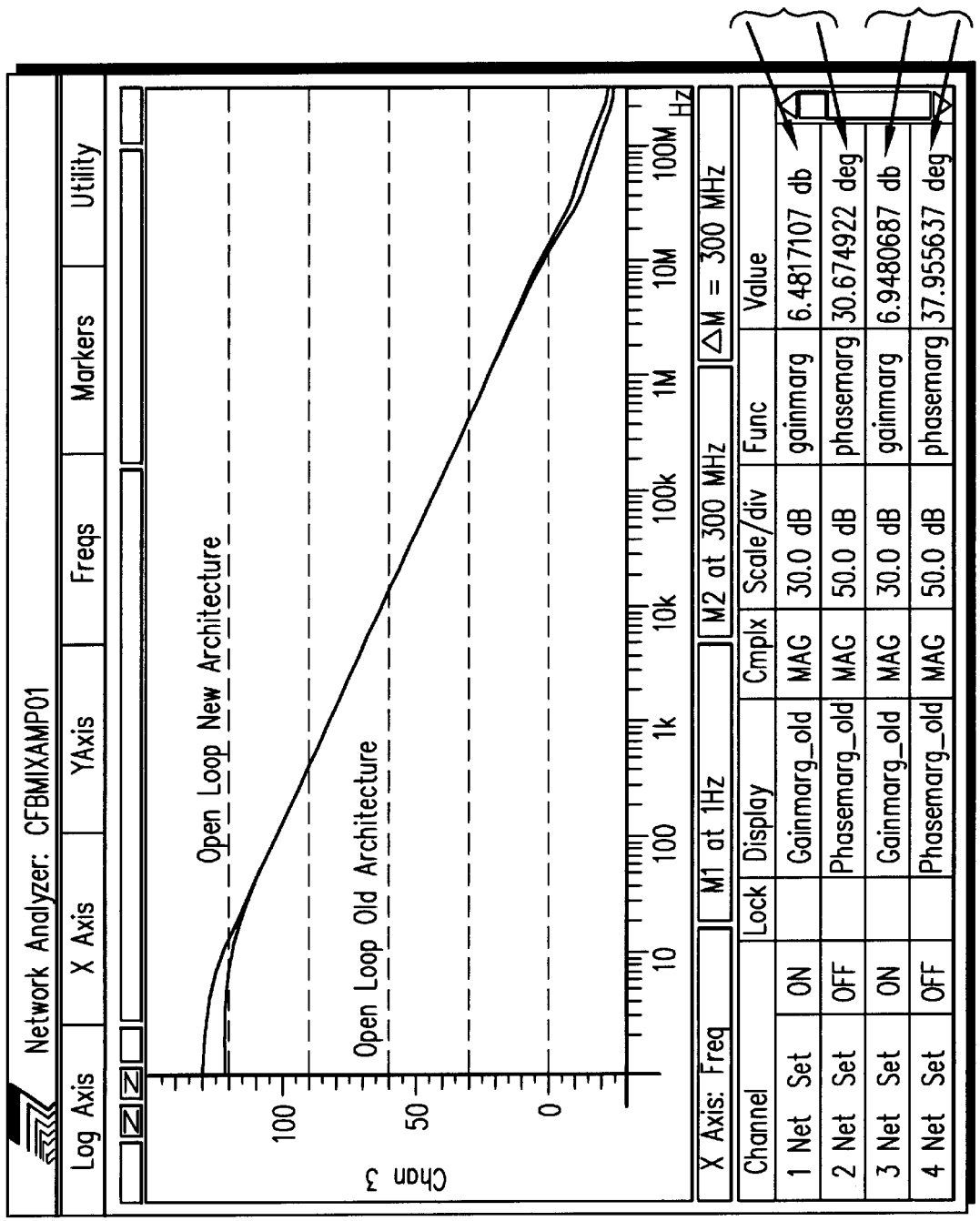
FIGS. 6 and 7 are diagrams representing, respectively, closed loop and open loop frequency responses for both architecture in FIG. 5a and FIG. 5b.
Figure 7:
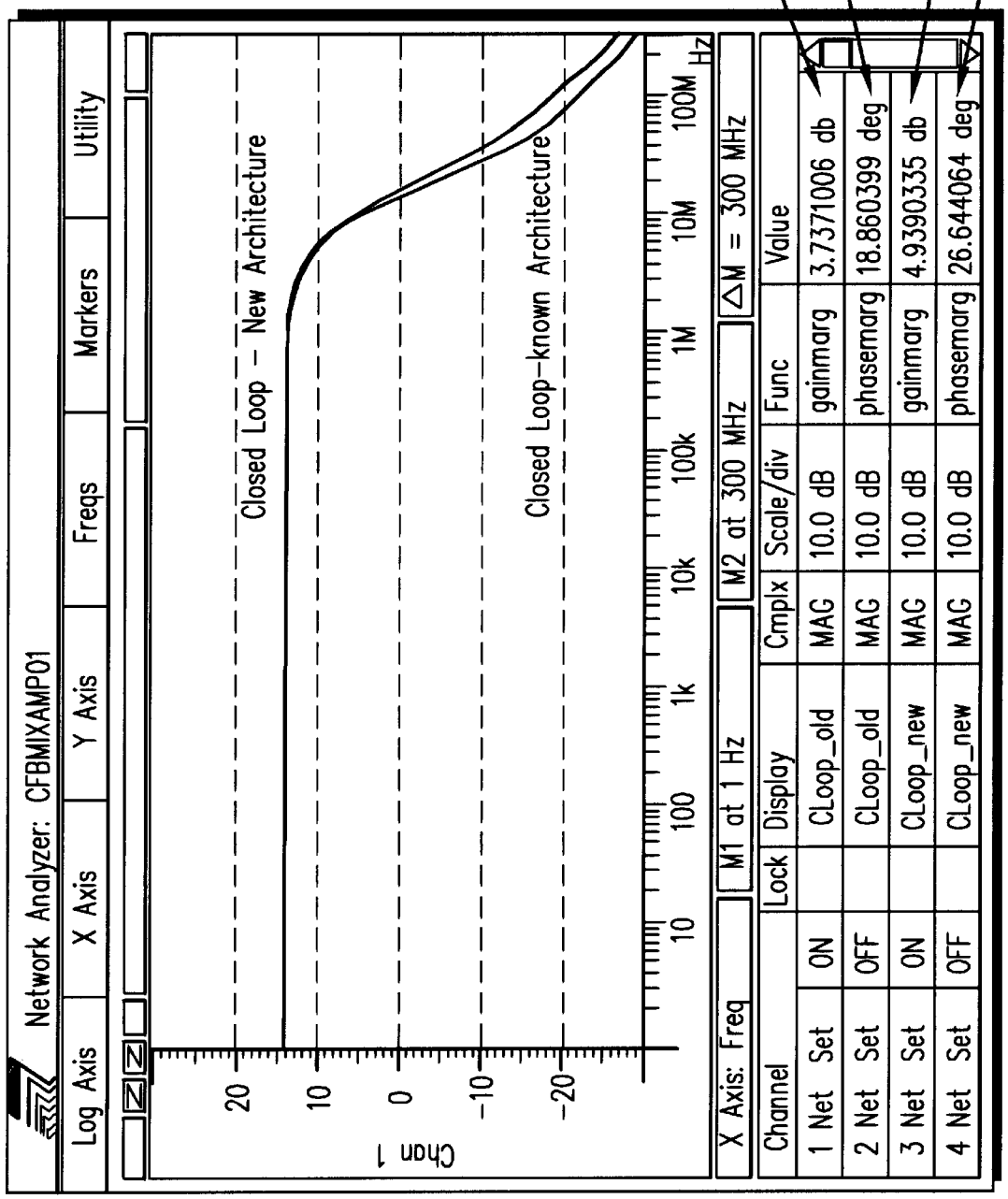

Open loop and closed loop frequency responses are shown in FIG. 6 and FIG. 7, respectively, both for the new precision, high gain and high speed architecture and a conventional known architecture with a class AB input stage, obtained from FIG. 5a by simply diverting the upper arms of the input stage to the positive supply rail (+Vcc), as shown in FIG. 5b.

It is to be noted the extremely high open loop dc-gain (>140 dB) and the improved gain-phase margins obtained with the new architecture.

Figure 8:
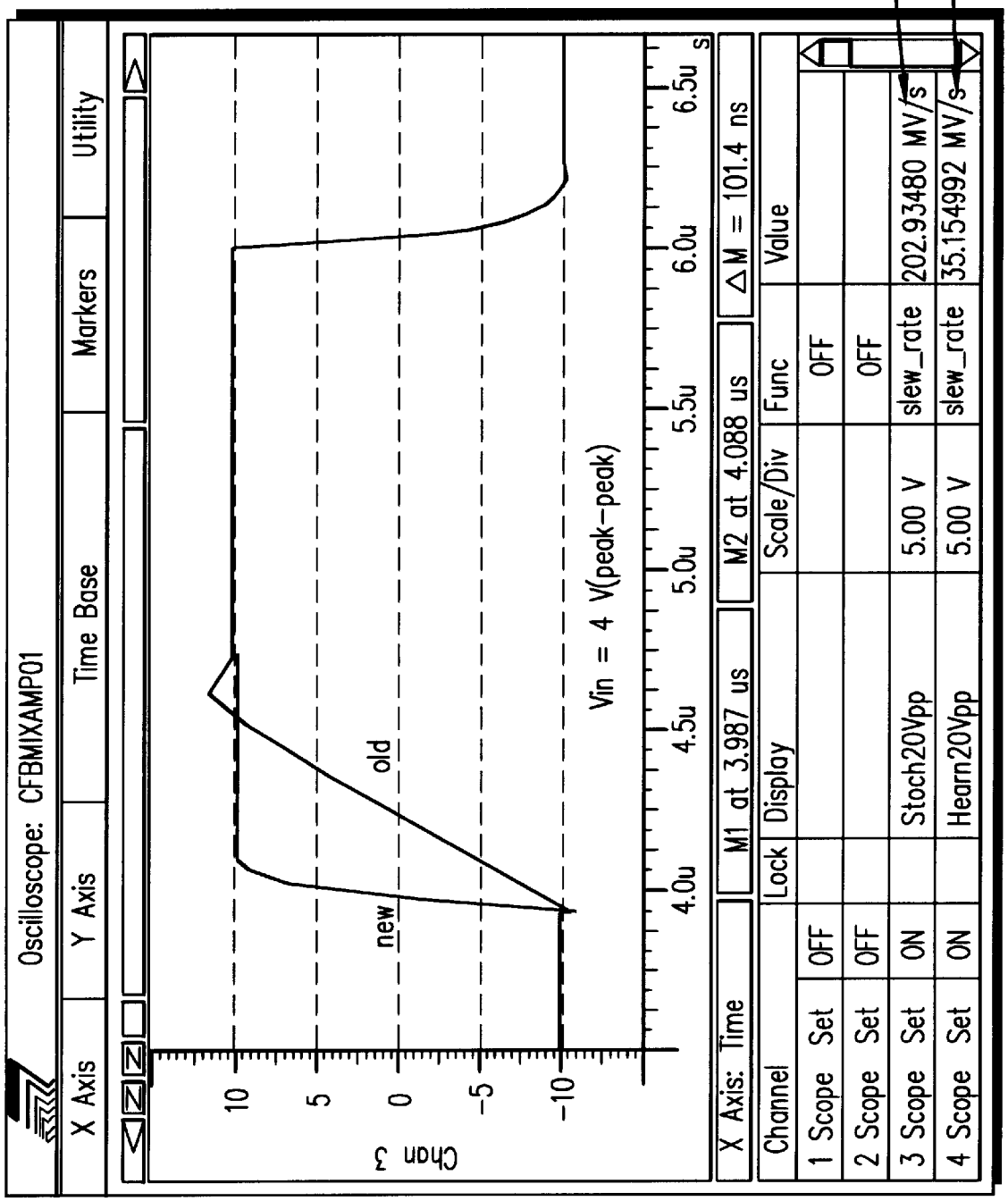

The square wave response for small signal of FIG. 5a is shown in FIG. 8. The cleanness of the response and the faithful pulse reproduction is apparent.

Figure 9:
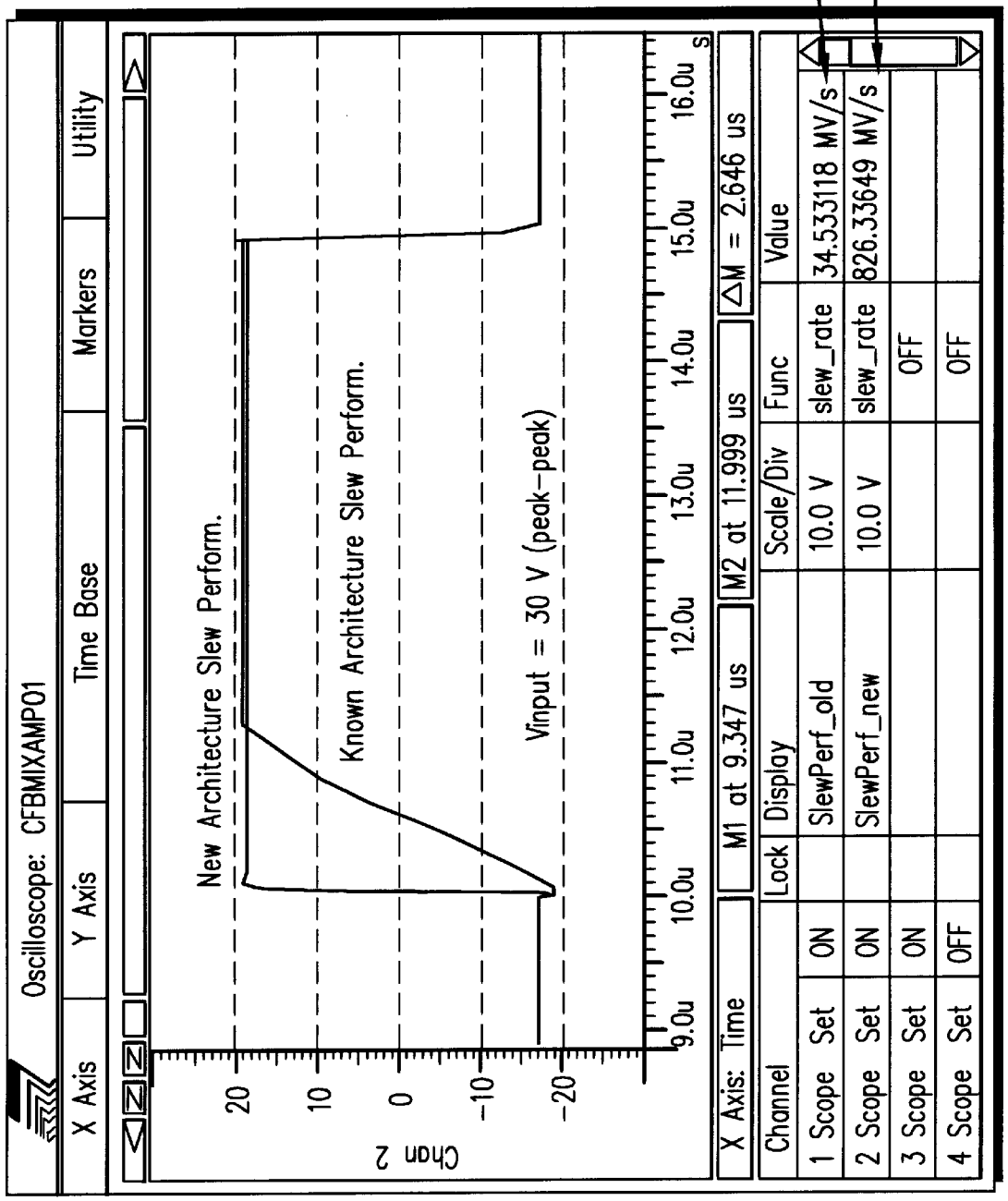
FIGS. 9 and 10 are diagrams representing the response to a large signal, but still included in linear dynamic range of input voltage, for architectures of FIG. 5a and FIG. 5b, respectively.
Figure 10:
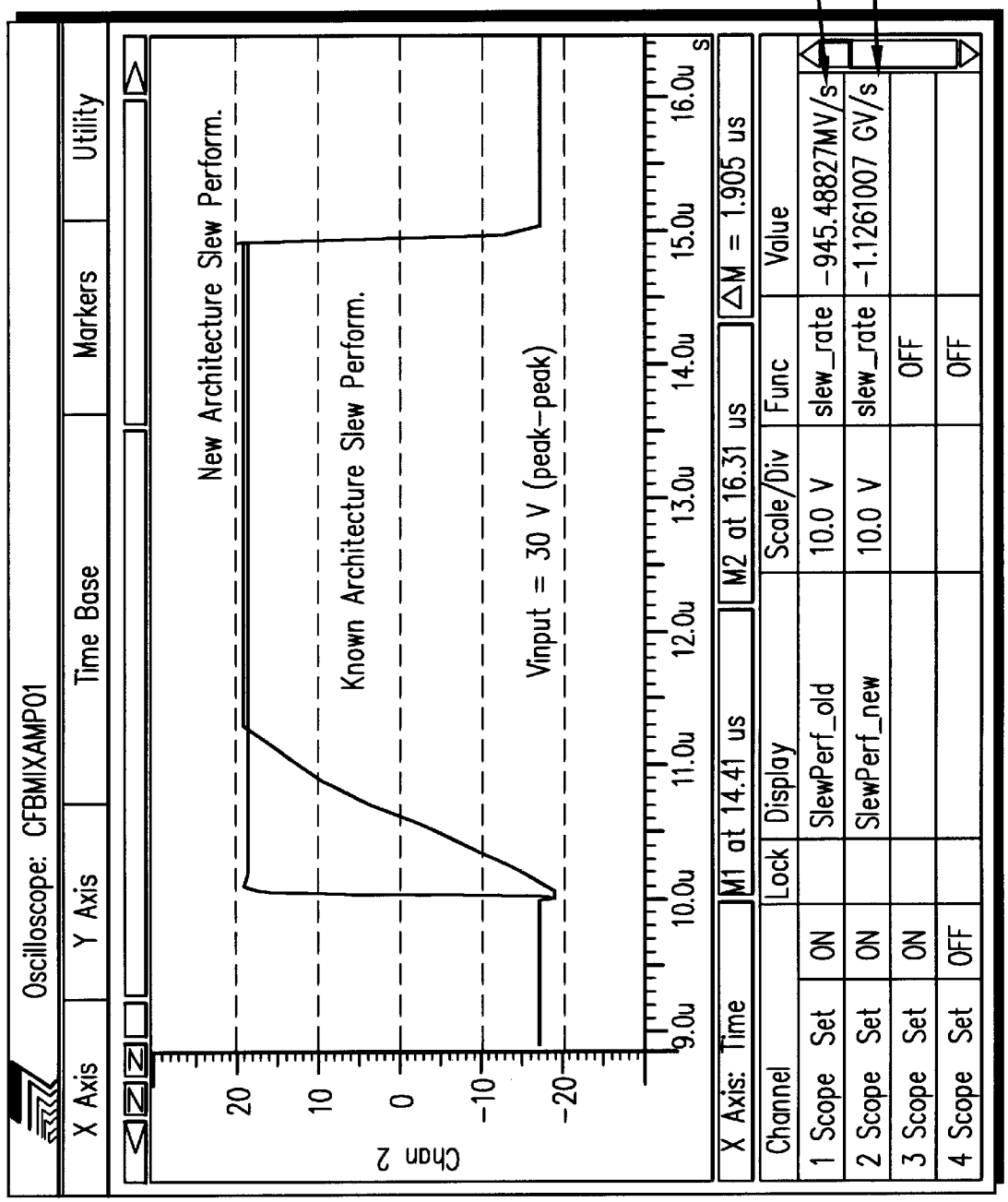

The response to a large input signal (30 Vpeak-peak), but still within the linear input voltage dynamic range, is shown in FIGS. 9 and 10, where rising edge and falling edge slew-rates, SR(r) and SR(f) respectively, are highlighted, both for the new (FIG. 5a) and for the known (FIG. 5b) architectures.

Figure 11:
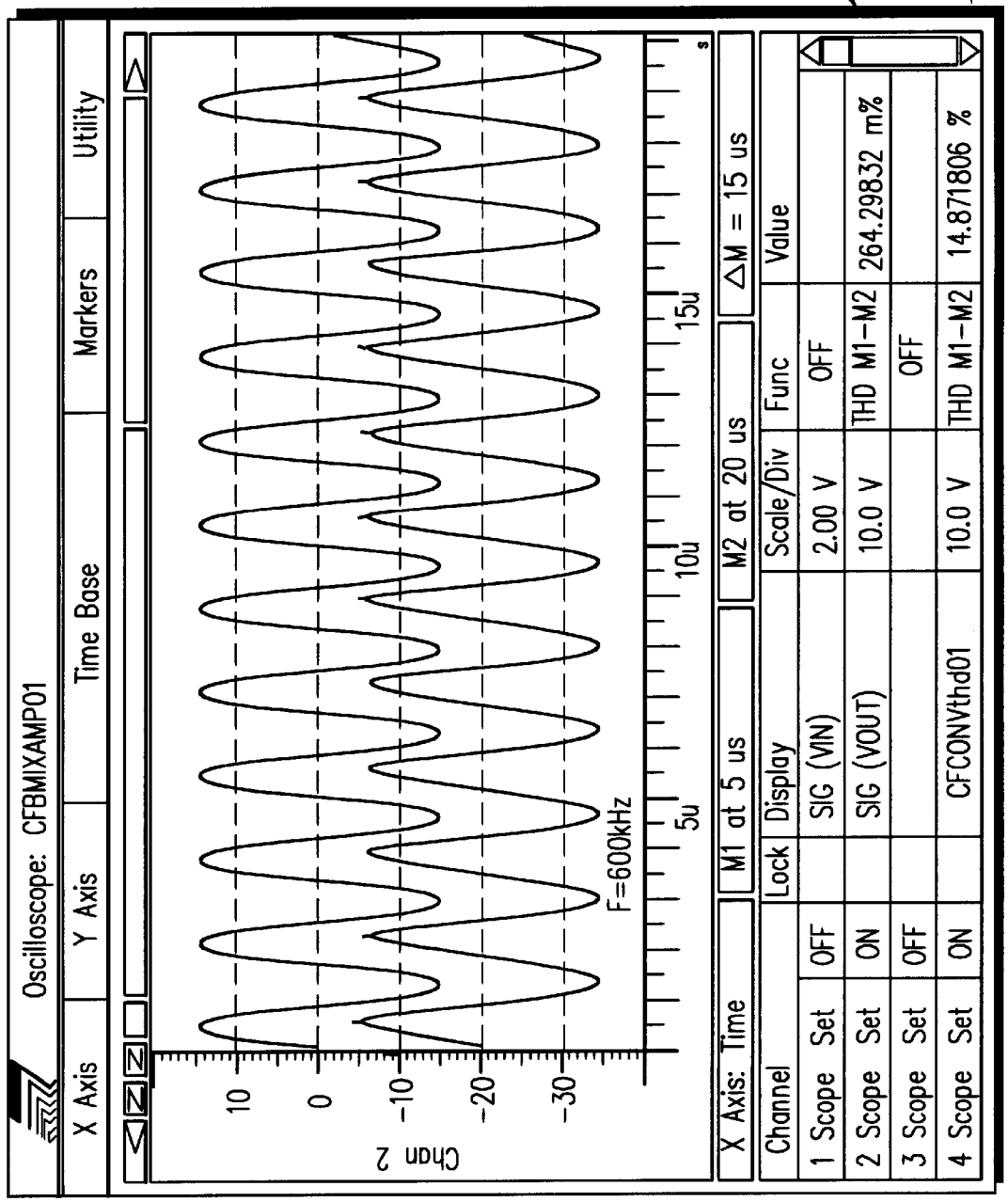
FIG. 11 shows a comparison of performance related to speed and distortion (THD), in the same architectures.

Finally, FIG. 11 shows a comparison 600 kHz THD performance for an output voltage of 30 V (peak-peak).

SPICE simulation results demonstrate that current consumption, open loop gain and offset voltage are substantially the same for both known and new architecture, but speed and high frequency non-linear distortion (THD) performances are very different, as shown in the same figures. The following table reports a brief summary of the main performances of the new architecture according to the invention, compared with a well known, conventional precision and fast operational amplifier architecture.

TABLE 1

SUMMARY OF MAIN SPICE SIMULATED PERFORMANCES

| TECHNIQUE | SUPPLY CURRENT | INPUT OFFSET VOLTAGE | DISTORTION THD @ 600 KHZ Vo = 30 Vpp Rload = 600 Ohm | POWER BANDWIDTH @ Vo = 30 Vpp Rload = 600 Ohm | SLEW RATE @ Vo = 30 Vpp Rload 600 Ohm |
|---|---|---|---|---|---|
| NEW PRECISION & FAST ARCHITECTURE (FIG 3A AND FIG. 5A) | ~8 mA | 1.2 mV | 0.26% | 1.9 MHz | +826 V/μs & −1100 V/μs |
| KNOWN PRECISION & FAST ARCHITECTURE(*) | ~8 mA | 1.1 mV | 14.80% | 83 kHz | +35 V/μs & −946 V/μs |

(*)Known precision and high speed conventional architecture (Hearn) (FIG. 1 with Class AB input stage)

It is understood that other embodiments and/or modifications of the improved amplifier architecture are possible, which are included within the scope of this invention. Particularly, it is possible to use even an upper half possessing high gain and a lower half possessing low gain. Furthermore, it is possible to adopt also different schemes for frequency compensation.

What is claimed is:

1. Amplifier with improved, high precision, high speed and low power consumption architecture, comprising an input stage (1), an intermediate stage (2) and an output stage (3), characterised in that the intermediate stage (2) is obtained by combining two complementary class AB operating halves (2a, 2b), which are driven by a complementary input stage, which, in turn, is class AB operating, one of said halves having a low limited current gain ($G_U$) and the other having a high or very high current gain ($G_D$).

2. Amplifier with improved architecture as claimed in claim 1), the input stage (1) of which, which is class AB operating, provides two pairs of antiphase output currents ($I_R$ and $I_L$), apt to be used to feed both halves (2a, 2b) of the intermediate stage.

3. Amplifier with improved architecture as claimed in claim 1, in which the current gain ($G_u$) of a first of said halves of the intermediate stage is controlled.

4. Amplifier with improved architecture as claimed in claim 1, in which also the current gain ($G_D$) of a second of said two halves of the intermediate stage is controlled.

5. Amplifier with improved architecture as claimed in claim 1), implemented by using a bipolar technology.

6. Amplifier with improved architecture as claimed in claim 1), implemented by using a MOS technology.

7. Amplifier with improved architecture as claimed in claim 1), implemented by using a BiCMOS technology.

8. The amplifier of claim 3, wherein said current gain of the first of said halves of the intermediate stage is controlled by local negative feedback.

9. The amplifier of claim 3, wherein said current gain of the second of said halves of the intermediate stage is controlled by local negative feedback.

10. Amplifier comprising:

an input stage;

an intermediate stage;

an output stage; and wherein said intermediate stage includes in combination two complementary class AB operating halves which are driven by a complimentary input stage, which in turn is class AB operating, wherein one of said halves has a low limited current gain and the other half has a high current gain.

* * * * *